United States Patent
Pendse

(10) Patent No.: US 7,973,406 B2
(45) Date of Patent: *Jul. 5, 2011

(54) BUMP-ON-LEAD FLIP CHIP INTERCONNECTION

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/716,455

(22) Filed: Mar. 3, 2010

(65) Prior Publication Data

US 2010/0164100 A1    Jul. 1, 2010

Related U.S. Application Data

(63) Continuation of application No. 12/062,293, filed on Apr. 3, 2008, now Pat. No. 7,700,407.

(51) Int. Cl.
   *H01L 23/48* (2006.01)
   *H01L 21/44* (2006.01)
(52) U.S. Cl. . 257/734; 257/737; 257/778; 257/E23.021; 438/107; 438/108; 438/612; 438/613
(58) Field of Classification Search .................. 438/107, 438/108, 612–615; 257/734, 737, 778, E23.021
   See application file for complete search history.

(56) References Cited

U.S. PATENT DOCUMENTS

| | | |
|---|---|---|
| 6,383,916 B1 | 5/2002 | Lin |
| 6,409,073 B1 | 6/2002 | Kaskoun et al. |
| 6,458,622 B1 | 10/2002 | Keser et al. |
| 6,660,560 B2 | 12/2003 | Chaudhuri et al. |
| 6,678,948 B1 | 1/2004 | Benzler et al. |
| 6,774,497 B1 | 8/2004 | Qi et al. |
| 6,821,878 B2 | 11/2004 | Danvir et al. |
| 7,173,828 B2 | 2/2007 | Lin et al. |
| 2001/0013423 A1 | 8/2001 | Dalal et al. |

FOREIGN PATENT DOCUMENTS

| | | |
|---|---|---|
| JP | 04-355933 | 9/1992 |
| JP | 6503687 | 4/1994 |
| JP | 09097791 | 4/1997 |
| JP | 11145176 A | 5/1999 |
| JP | 11233571 A | 8/1999 |
| JP | 2001156203 A | 6/2001 |
| JP | 2002270732 A | 9/2002 |
| JP | 05-028037 | 4/2005 |
| JP | 2005109187 A | 4/2005 |

*Primary Examiner* — Hsien-ming Lee
(74) *Attorney, Agent, or Firm* — Robert D. Atkins; Patent Law Group

(57) ABSTRACT

A semiconductor device has a semiconductor die with a plurality of bumps formed over the die. A substrate has a plurality of conductive traces formed on the substrate. Each trace has an interconnect site for mating to the bumps. The interconnect sites have parallel edges along a length of the conductive traces under the bumps from a plan view for increasing escape routing density. The bumps have a noncollapsible portion for attaching to a contact pad on the die and fusible portion for attaching to the interconnect site. The fusible portion melts at a temperature which avoids damage to the substrate during reflow. The noncollapsible portion includes lead solder, and fusible portion includes eutectic solder. The interconnect sites have a width which is less than 1.2 times a width of the conductive trace. Alternatively, the interconnect sites have a width which is less than one-half a diameter of the bump.

23 Claims, 8 Drawing Sheets

BUMP-ON-LEAD FLIP CHIP INTERCONNECTION

CLAIM OF DOMESTIC PRIORITY

The present application is a continuation of U.S. application Ser. No. 12/062,293, filed Apr. 3, 2008, which is a division of U.S. application Ser. No. 10/985,654, now U.S. Pat. No. 7,368,817, filed Nov. 10, 2004.

FIELD OF THE INVENTION

This invention relates to semiconductor packaging and, particularly, to flip chip interconnection.

BACKGROUND OF THE INVENTION

Flip chip packages include a semiconductor die mounted onto a package substrate with the active side of the die facing the substrate. Conventionally, interconnection of the circuitry in the die with circuitry in the substrate is made by way of bumps which are attached to an array of interconnect pads on the die, and bonded to a corresponding (complementary) array of interconnect pads (often referred to as "capture pads") on the substrate.

The areal density of electronic features on integrated circuits has increased enormously, and chips having a greater density of circuit features also may have a greater density of sites for interconnection with a package substrate.

The package is connected to underlying circuitry, such as a printed circuit board (e.g., a "motherboard) in the device in which it is employed, by way of second level interconnects (e.g., pins) between the package and the underlying circuit. The second level interconnects have a greater pitch than the flip chip interconnects, and so the routing on the substrate conventionally "fans out". Significant technological advances have enabled construction of fine lines and spaces; but in the conventional arrangement space between adjacent pads limits the number of traces than can escape from the more inward capture pads in the array, and the fan out routing between the capture pads beneath the die and the external pins of the package is conventionally formed on multiple metal layers within the package substrate. For a complex interconnect array, substrates having multiple layers may be required to achieve routing between the die pads and the second level interconnects on the package.

Multiple layer substrates are expensive, and in conventional flip chip constructs the substrate alone typically accounts for more than half the package cost (about 60% in some typical instances). The high cost of multilayer substrates has been a factor in limiting proliferation of flip chip technology in mainstream products.

In conventional flip chip constructs the escape routing pattern typically introduces additional electrical parasitics, because the routing includes short runs of unshielded wiring and vias between wiring layers in the signal transmission path. Electrical parasitics can significantly limit package performance.

SUMMARY OF THE INVENTION

According to the invention flip chip interconnect is accomplished by connecting the interconnect bump directly onto a lead, rather than onto a pad. The invention provides more efficient routing of traces on the substrate. Particularly, the signal routing can be formed entirely in a single metal layer of the substrate. This reduces the number of layers in the substrate, and forming the signal traces in a single layer also permits relaxation of some of the via, line and space design rules that the substrate must meet. This simplification of the substrate greatly reduces the overall cost of the flip chip package. The bump-on-lead architecture also helps eliminate such features as vias and "stubs" from the substrate design, and enables a microstrip controlled impedance electrical environment for signal transmission, thereby greatly improving performance.

In one general aspect the invention features a flip chip interconnection having solder bumps attached to interconnect pads on a die and mated onto corresponding traces on a substrate.

In another general aspect the invention features a flip chip package including a die having solder bumps attached to interconnect pads in an active surface, and a substrate having electrically conductive traces in a die attach surface, in which the bumps are mated directly onto the traces.

In general the bump-on-lead interconnection is formed according to methods of the invention without use of a solder mask to confine the molten solder during a re-melt stage in the process. Avoiding the need for a solder mask allows for finer interconnection geometry.

In some embodiments the substrate is further provided with a solder mask having openings over the interconnect sites on the leads. In some embodiments the substrate is further provided with solder paste on the leads at the interconnect sites.

In another general aspect the invention features a method for forming flip chip interconnection, by providing a substrate having traces formed in a die attach surface and a die having bumps attached to interconnect pads in an active surface; supporting the substrate and the die; dispensing a quantity of a curable adhesive on the substrate (covering at least the connection sites on the traces) or on the active side of the die (covering at least the bumps); positioning the die with the active side of the die toward the die attach surface of the substrate, and aligning the die and substrate and moving one toward the other so that the bumps contact the corresponding traces (leads) on the substrate; applying a force to press the bumps onto the mating traces, sufficient to displace the adhesive from between the bump and the mating trace; at least partially curing the adhesive; melting and then re-solidifying the solder, forming a metallurgical interconnection between the bump and the trace.

In another general aspect the invention features a method for forming flip chip interconnection, by providing a substrate having traces formed in a die attach surface and having a solder mask having openings over interconnect sites on the leads, and a die having bumps attached to interconnect pads in an active surface; supporting the substrate and the die; positioning the die with the active side of the die toward the die attach surface of the substrate, and aligning the die and substrate and moving one toward the other so that the bumps contact the corresponding traces (leads) on the substrate; melting and then re-solidifying to form the interconnection between the bump and the trace.

In some embodiments the solder bump includes a collapsible solder portion, and the melt and solidifying step melts the bump to form the interconnection on the lead. In some embodiments the substrate is further provided with a solder paste on the leads, and the step of moving the die and the substrate toward one another effects a contact between the bumps and the solder on the leads, and the melt and solidifying step melts the solder on the lead to form the interconnection.

In another general aspect the invention features a method for forming flip chip interconnection, by providing a substrate having traces formed in a die attach surface and having a solder mask having openings over interconnect sites on the leads and having solder paste on the leads at the interconnect sites, and a die having bumps attached to interconnect pads in an active surface; supporting the substrate and the die; positioning the die with the active side of the die toward the die attach surface of the substrate, and aligning the die and substrate and moving one toward the other so that the bumps contact the solder paste on the corresponding traces (leads) on the substrate; melting and then re-solidifying the solder paste, forming a metallurgical interconnection between the bump and the trace.

DETAILED DESCRIPTION OF THE DRAWINGS

The invention will now be described in further detail by reference to the drawings, which illustrate alternative embodiments of the invention. The drawings are diagrammatic, showing features of the invention and their relation to other features and structures, and are not made to scale. For improved clarity of presentation, in the figures illustrating embodiments of the invention, elements corresponding to elements shown in other drawings are not all particularly renumbered, although they are all readily identifiable in all the figures.

The conventional flip chip interconnection is made by using a melting process to join the bumps (conventionally, solder bumps) onto the mating surfaces of the corresponding capture pads and, accordingly, this is known as a "bump-on-capture pad" ("BOC") interconnect. Two features are evident in the BOC design: first, a comparatively large capture pad is required to mate with the bump on the die; second, an insulating material, typically known as a "solder mask" is required to confine the flow of solder during the interconnection process. The solder mask opening may define the contour of the melted solder at the capture pad ("solder mask defined"), or the solder contour may not be defined by the mask opening ("non-solder mask defined"); in the latter case—as in the example of FIG. 1, described in more detail below—the solder mask opening may be significantly larger than the capture pad. The techniques for defining solder mask openings have wide tolerance ranges. Consequently, for a solder mask defined bump configuration, the capture pad must be large (typically considerably larger than the design size for the mask opening), to ensure that the mask opening will be located on the mating surface of the pad; and for a non-solder mask defined bump configuration, the solder mask opening must be larger than the capture pad. The width of capture pads (or diameter, for circular pads) is typically about the same as the ball (or bump) diameter, and can be as much as two to four times wider than the trace width. This results in considerable loss of routing space on the top substrate layer. In particular, for example, the "escape routing pitch" is much bigger than the finest trace pitch that the substrate technology can offer. This means that a significant number of pads must be routed on lower substrate layers by means of short stubs and vias, often beneath the footprint of the die, emanating from the pads in question.

Figure 1:
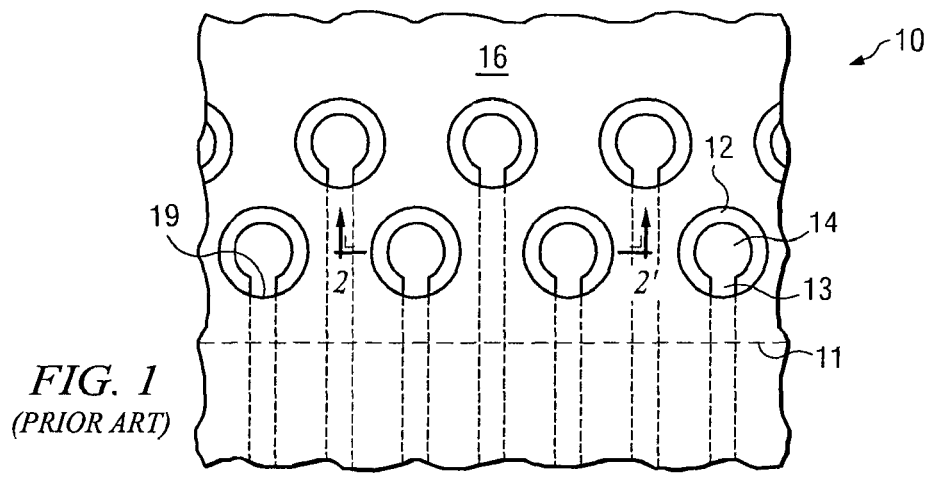
FIG. 1 is a diagrammatic sketch of a portion of a conventional bump-on-capture pad flip chip interconnection, in a sectional view parallel to the plane of the package substrate surface, as indicated by the arrows 1-1' in FIG. 2.
Figure 2:
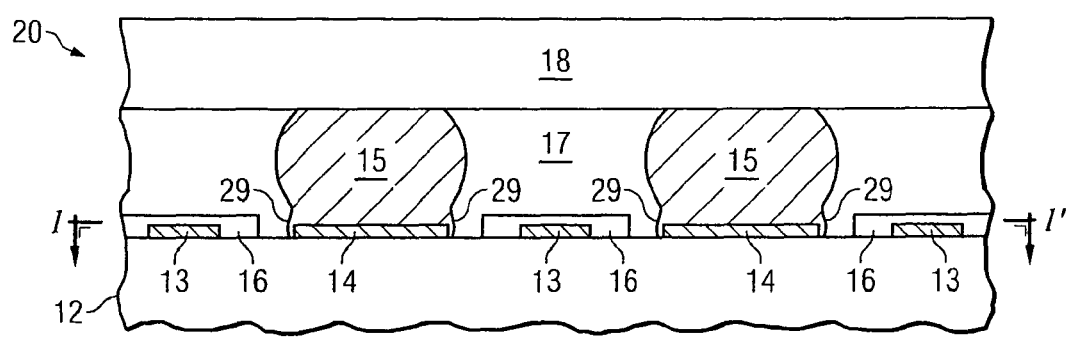
FIG. 2 is a diagrammatic sketch showing a portion of a conventional bump-on-capture pad flip chip interconnection, in a sectional view perpendicular to the plane of the package substrate surface, as indicated by the arrows 2-2' in FIG. 1.

FIGS. 1 and 2 show portions 10, 20 of a conventional flip chip package, in diagrammatic sectional views; the partial sectional view in FIG. 1 is taken in a plane parallel to the package substrate surface, along the line 1-1' in FIG. 2; and the partial sectional view in FIG. 2 is taken in a plane perpendicular to the package substrate surface, along the line 2-2' in FIG. 1. Certain features are shown as if transparent, but many of the features in FIG. 1 are shown at least partly obscured by overlying features. Referring now to both FIG. 1 and FIG. 2, a die attach surface of the package substrate includes a metal or layer formed on a dielectric layer 12. The metal layer is patterned to form leads 13 and capture pads 14. A insulating layer 16, typically termed a "solder mask", covers the die attach surface of the substrate; the solder mask is usually constructed of a photodefinable material, and is patterned by conventional photoresist patterning techniques to leave the mating surfaces of the capture pads 14 exposed. Interconnect bumps 15 attached to pads on the active side of the die 18 are joined to the mating surfaces of corresponding capture pads 14 on the substrate to form appropriate electrical interconnection between the circuitry on the die and the leads on the substrate. After the reflowed solder is cooled to establish the electrical connection, an underfill material 17 is introduced into the space between the die 18 and the substrate 12, mechanically stabilizing the interconnects and protecting the features between the die and the substrate.

As FIG. 1 shows by way of example, signal escape traces in the upper metal layer of the substrate (leads 13), lead from their respective capture pads 14 across the die edge location, indicated by the broken line 11, and away from the die footprint. In a typical example the signal traces may have an escape pitch $P_E$ about 112 um. A 30 um/30 um design rule is typical for the traces themselves in a configuration as shown in FIG. 1; that is, the traces are nominally 30 um wide, and they can be spaced as close together as 30 um. The capture pads are typically three times greater than the trace width and, accordingly in this example the capture pads have a width (or diameter, as they are roughly circular in this example) nominally 90 um. And, in this example, the openings in the solder mask are larger than the pads, having a nominal width (diameter) of 135 um.

FIGS. 1 and 2 show a non-solder mask defined solder contour. As the fusible material of the bumps on the die melt, the molten solder tends to "wet" the metal of the leads and capture pads, and the solder tends to "run out" over any contiguous metal surfaces that are not masked. The solder tends to flow along the contiguous lead 13, and here the solder flow is limited by the solder mask, for example at 19 in FIG. 1. A non-solder mask defined solder contour at the pad is apparent in FIG. 2, in which the material of the bumps 15 is shown as having flowed, 29, over the sides of the capture pads 14 and down to the surface of the dielectric layer of the substrate 12. This is referred to as a non-solder mask defined contour because the solder mask does not limit the flow of solder over the surface and down over the sides of the capture pads, and—unless there is a substantial excess of solder at the pad—the flow of solder is limited by the fact that the dielectric surface of the substrate is typically not wettable by the molten solder. A lower limit on the density of the capture pads in a conventional arrangement, as in FIG. 1, is determined by, among other factors, limits on the capacity of the mask forming technology to make reliable narrow mask structures, and the need to provide mask structures between adjacent mask openings. A lower limit on the escape density is additionally determined by, among other factors, the need for escape lines from more centrally located capture pads to be routed between more peripherally located capture pads.

Figure 3:
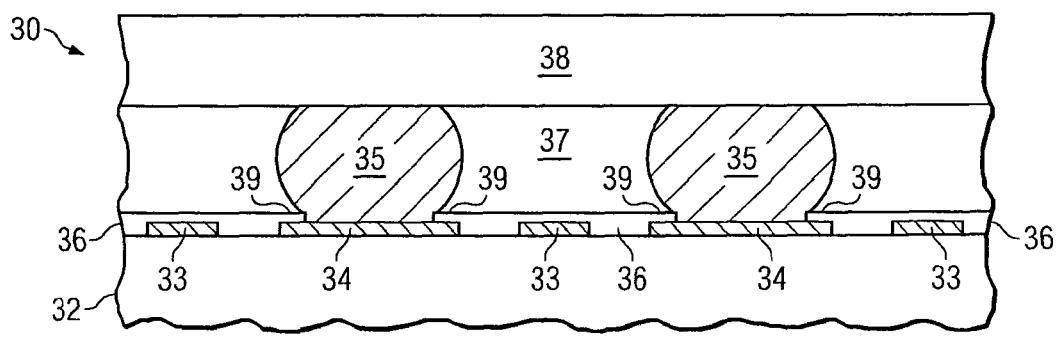
FIG. 3 is a diagrammatic sketch showing a portion of another conventional bump-on-capture pad flip chip interconnection, in a sectional view perpendicular to the plane of the package substrate surface.

FIG. 3 shows a conventional solder mask defined solder contour, in a sectional view similar to that in FIG. 2. A die 38 is shown affixed by way of bumps 35 onto the mating surfaces of capture pads 34 formed along with traces (leads 33) by patterning a metal layer on the die attach side of a dielectric layer of the substrate 32. After the reflowed solder is cooled to establish the electrical connection, an underfill material 37 is introduced into the space between the die 38 and the substrate 32, mechanically stabilizing the interconnects and protecting the features between the die and the substrate. Here the capture pads 34 are wider than in the example of FIGS. 1 and 2, and the solder mask openings are smaller than the capture pads, so that the solder mask material covers the sides and part of the mating surface each capture pad, as shown at 39, as well as the leads 33. When the bumps 35 are brought into contact with the mating surfaces of the respective capture pads 34, and then melted, the solder mask material 36 restricts the flow of the molten solder, so that the shapes of the solder contours are defined by the shapes and dimensions of the mask openings over the capture pads 34.

Figure 4:
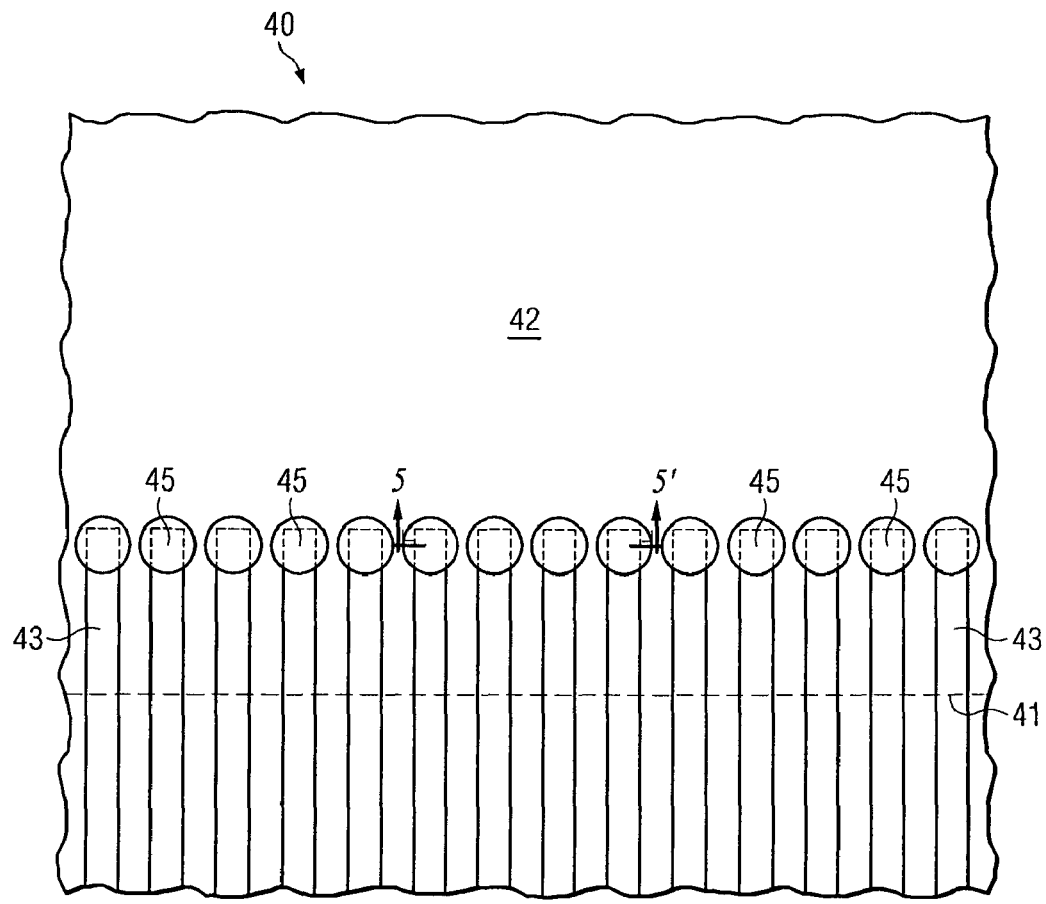
FIG. 4 is a diagrammatic sketch of a portion of an embodiment of a bump-on-lead flip chip interconnection according to the invention, in a sectional view parallel to the plane of the package substrate surface.
Figure 5:
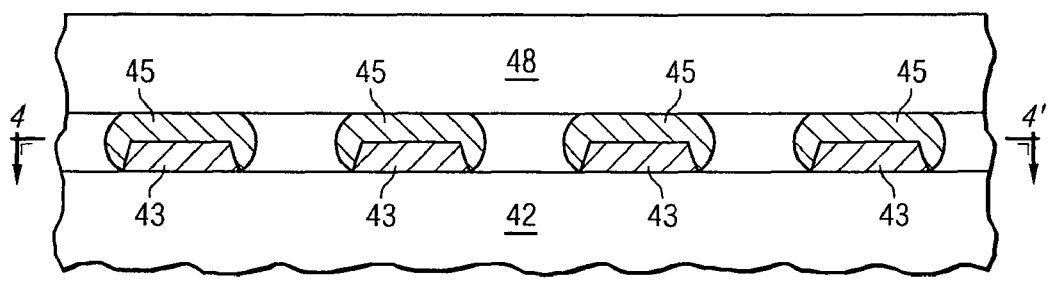
FIG. 5 is a diagrammatic sketch showing a portion of an embodiment of a bump-on-lead flip chip interconnection according to the invention as in FIG. 4, in a sectional view perpendicular to the plane of the package substrate surface, as indicated by the arrows 6-6' in FIG. 4.
Figure 6:
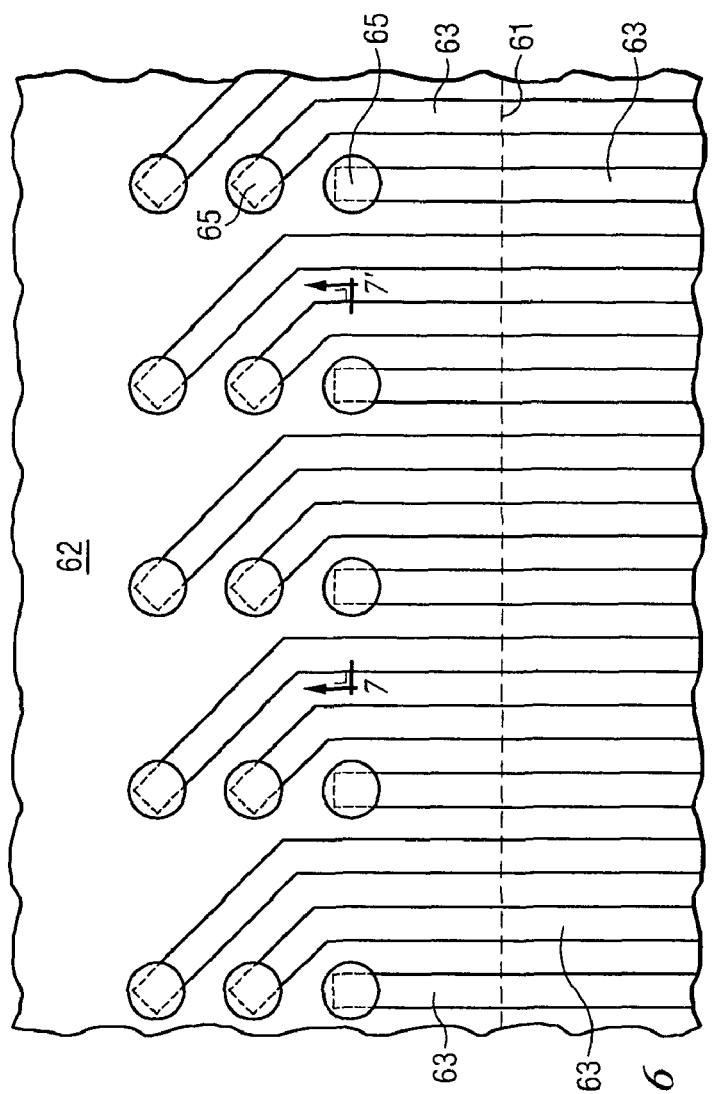
FIG. 6 is a diagrammatic sketch of a portion of another embodiment of a bump-on-lead flip chip interconnection according to the invention, in a sectional view parallel to the plane of the package substrate surface.
Figure 7:
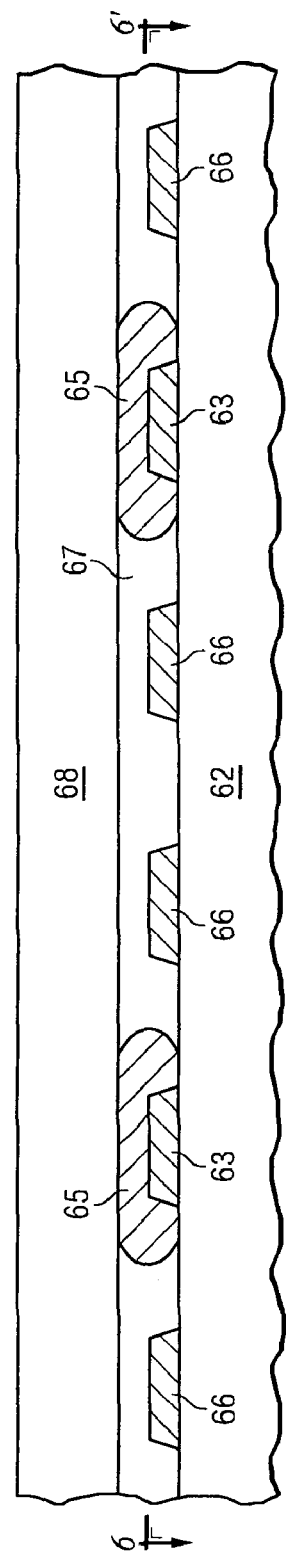
FIG. 7 is a diagrammatic sketch showing a portion of an embodiment of a bump-on-lead flip chip interconnection according to the invention as in FIG. 6, in a sectional view perpendicular to the plane of the package substrate surface, as indicated by the arrows 7-7' in FIG. 6.

FIGS. 4 and 6 each show a portion of a bump-on-lead ("BOL") flip chip interconnection according to an embodiment of the invention, in a diagrammatic partial sectional view taken in a plane parallel to the substrate surface, along the lines 4-4' and 6-6' in FIGS. 5 and 7, respectively. Certain features are shown as if transparent. According to the invention the interconnection is achieved by mating the bumps directly onto respective narrow leads or traces on the substrate and, accordingly, this is referred to herein as a "bump-on-lead" ("BOL") interconnect. Solder mask materials typically cannot be resolved at such fine geometries and, according to these embodiments of the invention, no solder mask is used. Instead the function of confining molten solder flow is accomplished without a solder mask in the course of the assembly process (as described below). FIG. 5 shows a partial sectional view of a package as in FIG. 4, taken in a plane perpendicular to the plane of the package substrate surface, along the line 5-5' in FIG. 4; and FIG. 7 shows a partial sectional view of a package as in FIG. 6, taken in a plane perpendicular to the plane of the package substrate surface, along the line 7-7' in FIG. 6.

Escape routing patterns for bump-on-lead ("BOL") substrates according to the invention are shown by way of example in FIGS. 4 and 6: in FIG. 4, arranged for a die on which the die attach pads for the interconnect balls are in a row near the die perimeter, the bumps 45 are mated onto corresponding interconnect sites on the escape traces 43 in a row near the edge of the die footprint, indicated by the broken line 41; in FIG. 6, arranged for a die on which the die attach pads are in an array of parallel rows near the die perimeter, the bumps 65 are mated onto corresponding interconnect sites on the escape traces 63 in a complementary array near the edge of the die footprint, indicated by the broken line 61.

As FIGS. 4 and 6 illustrate, the routing density achievable using bump-on-lead interconnect according to the invention can equal the finest trace pitch offered by the substrate technology. In the specific case illustrated, this constitutes a routing density which is approximately 90% higher than is achieved in a conventional bump-on-capture pad arrangement. In the perimeter row embodiments of BOL (e.g., FIG. 4), the bumps are placed at a fine pitch, which can equal the finest trace pitch of the substrate. This arrangement poses a challenge for the assembly process, because the bumping and bonding pitch must be very fine. In the perimeter array version of BOL (e.g., FIG. 6), the bumps are arranged on an area array, providing greater space for a larger bumping and bonding pitch, and relieving the technological challenges for the assembly process. Even in the array embodiments, the routing traces on the substrate are at the same effective pitch as in the perimeter row arrangement, and an arrangement as in FIG. 6 relieves the burden of fine pitch bumping and bonding without sacrificing the fine escape routing pitch advantage.

Referring particularly now to FIGS. 4 and 5, leads 43 are formed by patterning a metal layer on a die attach surface of a substrate dielectric layer 42. According to the invention, electrical interconnection of the die 48 is made by joining the bumps 45 on the die directly onto the leads 43. No capture pads are required according to the invention and, in embodiments as in FIGS. 4 and 5, no solder mask is required; the process is described in detail below.

Conventional capture pads typically are about the same width (diameter) as the bumps, and are typically two to four times as wide as the trace or lead width. As will be appreciated, some variation in the width of leads is expected. As used herein, a variation in trace width of as much as 120% of the nominal or trace design rule width does not constitute a capture pad, and bump-on-lead interconnection according to the invention includes bumps formed on such wider portions of leads.

Similarly, referring to FIGS. 6 and 7, leads 63 are formed by patterning a metal layer on a die attach surface of a substrate dielectric layer 62. The signal escape traces lead across the die edge location, indicated by the broken line 61, and away from the die footprint. According to the invention, electrical interconnection of the die 68 is made by joining the bumps 65 on the die directly onto the leads 63. Certain of the escape traces, e.g. 66, leading across the die edge location from interconnect sites in rows toward the interior of the die footprint, pass between the bumps 65 on more peripheral rows of interconnect sites. No capture pads are required according to the invention and, in embodiments as in FIGS. 6 and 7, no solder mask is required; the process is described in detail below.

As FIGS. 4 and 6 illustrate, bump-on-lead interconnect according to the invention can provide a significantly higher signal trace escape routing density. Also, as FIGS. 4 and 6 illustrate, the BOL interconnect according to this aspect of the invention does not require use of a solder mask to define the solder contour at the interconnect site.

The BOL interconnection structure of embodiments such as are shown by way of example in FIGS. 4, 5, 6 and 7 can be produced according to the invention by any of several methods, not requiring a solder mask. In general, interconnect bumps (typically solder bumps) are affixed onto interconnect pads on the active side of the die. A die attach surface of the substrate (termed the "upper" surface) has an upper metal layer patterned to provide the traces as appropriate for interconnection with the arrangement of bumps on the particular die. Because no capture pads are required, the patterned traces (leads) need only route through sites corresponding to a pattern complementary to the arrangement of bumps on the die. In a preferred method of the invention, an encapsulating resin adhesive is employed to confine the solder flow during a melt phase of the interconnection process.

Figure 8:
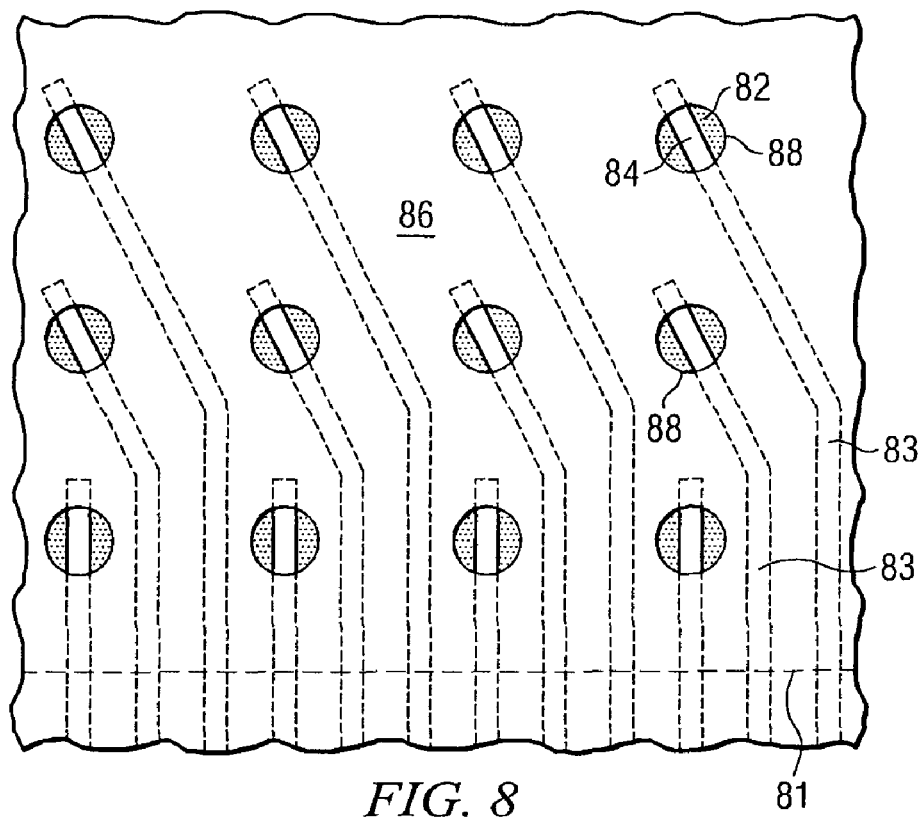
FIGS. 8 and 9 are diagrammatic sketches, each of a portion of another embodiment of a bump-on-lead flip chip interconnection according to the invention, in a sectional view parallel to the plane of the package substrate surface.
Figure 9:
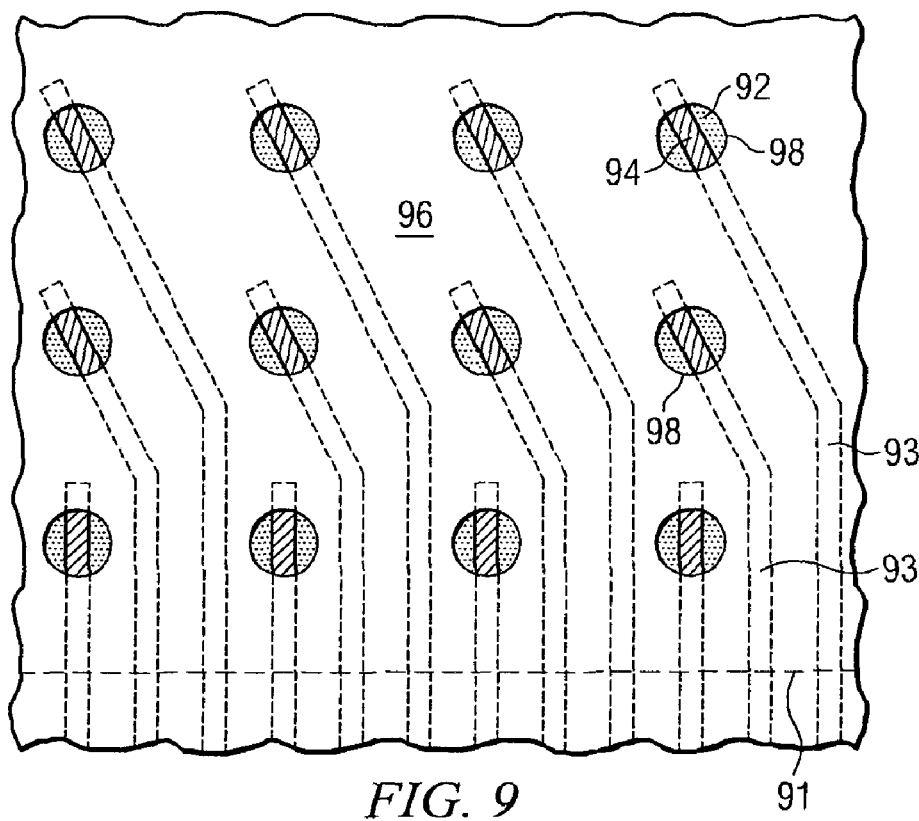

FIGS. 8 and 9 show two examples of a portion of a bump-on-lead flip chip interconnection according to other embodiments of the invention, in a diagrammatic sectional view taken in a plane parallel to the substrate surface. Certain features are shown as if transparent. According to this aspect of the invention a solder mask is provided, which may have a nominal mask opening diameter in the range about 80 um to 90 um. Solder mask materials can be resolved at such pitches and, particularly, substrates can be made comparatively inexpensively with solder masks having 90 um openings and having alignment tolerances plus or minus 25 um. In some embodiments laminate substrates (such as 4 metal layer laminates), made according to standard design rules, are used. In the embodiments of FIGS. 8 and 9, for example, the traces may be at ~90 um pitch and the interconnection sites may be in a 270 um area array, providing an effective escape pitch ~90 um across the edge of the die footprint, indicated by the broken line 81.

In embodiments as in FIGS. 8 and 9 a no-flow underfill is not required; a conventional capillary underfill can be employed.

In embodiments as in FIG. 8 the interconnection is achieved by mating the bumps directly onto an interconnect site 84 on a narrow lead or trace 83 patterned on a dielectric layer on the die attach surface of the substrate 82; there is no pad, and the solder mask 86 serves to limit flow of solder within the bounds of the mask openings 88, preventing solder flow away from the interconnect site along the solder-wettable lead. The solder mask may additionally confine flow of molten solder between leads, or this may be accomplished in the course of the assembly process.

In embodiments as in FIG. 9, as in FIG. 8, there are, according to the invention, no interconnect pads. Narrow leads or traces 93 patterned on a dielectric layer on the die attach surface of the substrate 92. Solder paste is provided at the interconnect sites 94 on the leads 93, to provide a fusible medium for the interconnect. The openings 98 in the solder mask 96 serve to define the paste. The paste is dispensed, for example by a standard printing process, then is reflowed, and then may be coined if necessary to provide uniform surfaces to meet the balls. The solder paste can be applied in the course of assembly using a substrate as described above with reference to FIG. 8; or, a substrate may be provided with paste suitably patterned prior to assembly. Other approaches to applying solder selectively to the interconnect sites may be employed in the solder-on-lead embodiments of the invention, including electroless plating and electroplating techniques. The solder-on-lead configuration provides additional solder volume for the interconnect, and can accordingly provide higher product yield, and can also provide a higher die standoff.

Accordingly, in some embodiments the solder-on-lead configuration according to the invention is employed for interconnection of a die having high-melting temperature solder bumps (such as a high-lead solder, conventionally used for interconnection with ceramic substrates) onto an organic substrate. The solder paste can be selected to have a melting temperature low enough that the organic substrate is not damaged during reflow. To form the interconnect in such embodiments the high-melting interconnect bumps are contacted with the solder-on-lead sites, and the remelt fuses the solder-on-lead to the bumps. Where a noncollapsible bump is used, together with a solder-on-lead process, no preapplied adhesive is required, as the displacement or flow of the solder is limited by the fact that only a small quantity of solder is present at each interconnect, and the noncollapsible bump prevents collapse of the assembly.

In other embodiments the solder-on-lead configuration according to the invention is employed for interconnection of a die having eutectic solder bumps.

Figure 10A:
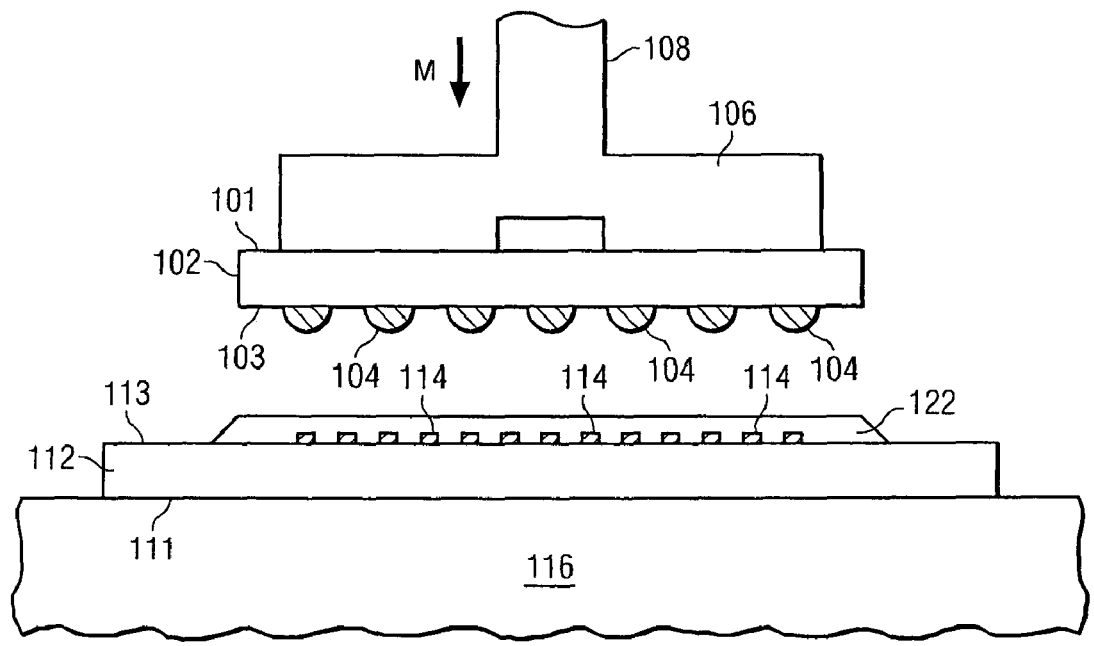
FIGS. 10A-10C are diagrammatic sketches in a sectional view illustrating steps in a process for making a flip chip interconnection according to the invention.
Figure 10B:
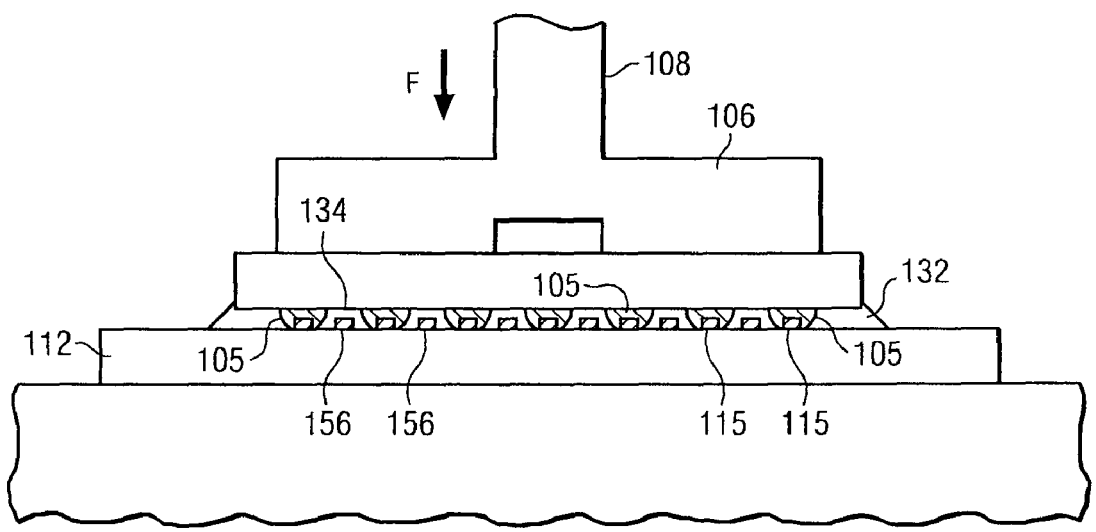
Figure 10C:
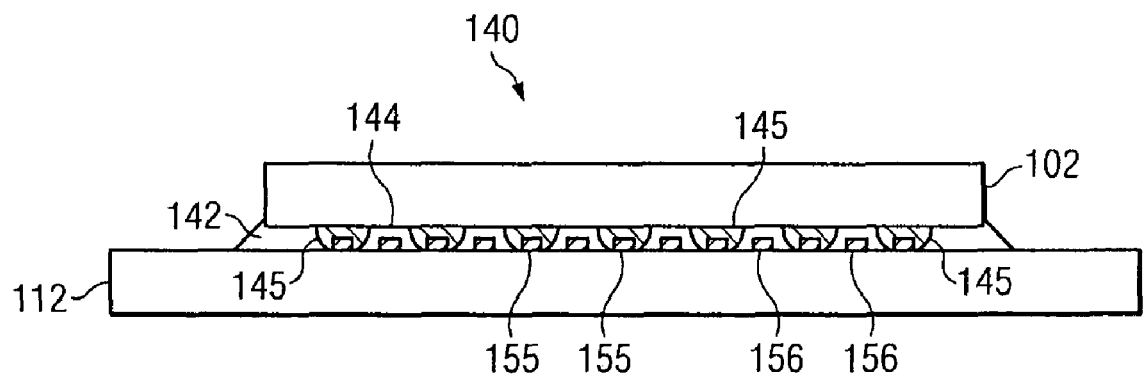

One embodiment of a preferred method for making a bump-on-lead interconnection is shown diagrammatically in FIGS. 10A-10C.

Referring to the figures, a substrate 112 is provided, having at least one dielectric layer and having a metal layer on a die attach surface 113, the metal layer being patterned to provide circuitry, particularly traces or leads 114 having sites for interconnection, on the die attach surface. The substrate 112 is supported, for example on a carrier or stage 116, with a substrate surface 111 opposite the die attach surface 113 facing the support. A quantity of an encapsulating resin 122 is dispensed over the die attach surface 113 of the substrate, covering at least the interconnect sites on the leads 114. A die 102 is provided, having bumps 104 attached to die pads (not shown in the figure) on the active side 103. The bumps include a fusible material which contacts the mating surfaces of the leads. A pick-and-place tool 108 including a chuck 106 picks up the die by contact of the chuck 106 with the backside 101 of the die. Using the pick-and-place tool, the die is positioned facing the substrate with the active side of the die toward the die attach surface of the substrate, as shown in FIG. 10A; and the die and substrate are aligned and moved one toward the other (arrow M) so that the bumps 104 contact the corresponding interconnect sites on the traces (leads) 114 on the substrate. Then a force is applied (arrow F) to press the bumps 105 onto the mating surfaces 134 at the interconnect sites on the leads 115, as shown in FIG. 10B. The force must be sufficient at least to displace the adhesive 122 from between the bumps and the mating surfaces at the interconnect sites on the leads 154. The bumps may be deformed by the force, breaking the oxide film on the contacting surface of the bumps and/or on the mating surface of leads. The deformation of the bumps may result in the fusible material of the bumps being pressed onto the top and over the edges of the lead. The adhesive is caused to cure at least partially, as shown at 132, as for example by heating to a selected temperature. At this stage the adhesive need only be partially cured, that is, only to an extent sufficient subsequently to prevent flow of molten solder along an interface between the adhesive and the conductive traces. Then the fusible material of the bumps 105 is melted and then is re-solidified, forming a metallurgical interconnection between the bump 105 and lead 115, and the adhesive curing is completed, to complete the die mount and to secure the electrical interconnection at the mating surface (now an interconnect interface) 144, as shown generally at 140 in FIG. 10C. In the plane of the sectional view shown in FIG. 10C, interconnection is formed between certain of the bumps 145 and corresponding interconnect sites on certain of the leads 155, as for example in a configuration as in FIG. 6. Other leads 156 are interconnected at other localities, which would be visible in other sectional views. A comparatively high trace density is shown. The curing of the adhesive 142 may be completed prior to, or concurrently with, or following melting the solder. Typically, the adhesive is a thermally curable adhesive, and the extent of curing at any phase in the process is controlled by regulating the temperature. The components can be heated and cured by raising the temperature of the chuck on the pick and place tool, or by raising the temperature of the substrate support, for example.

Figure 11A:
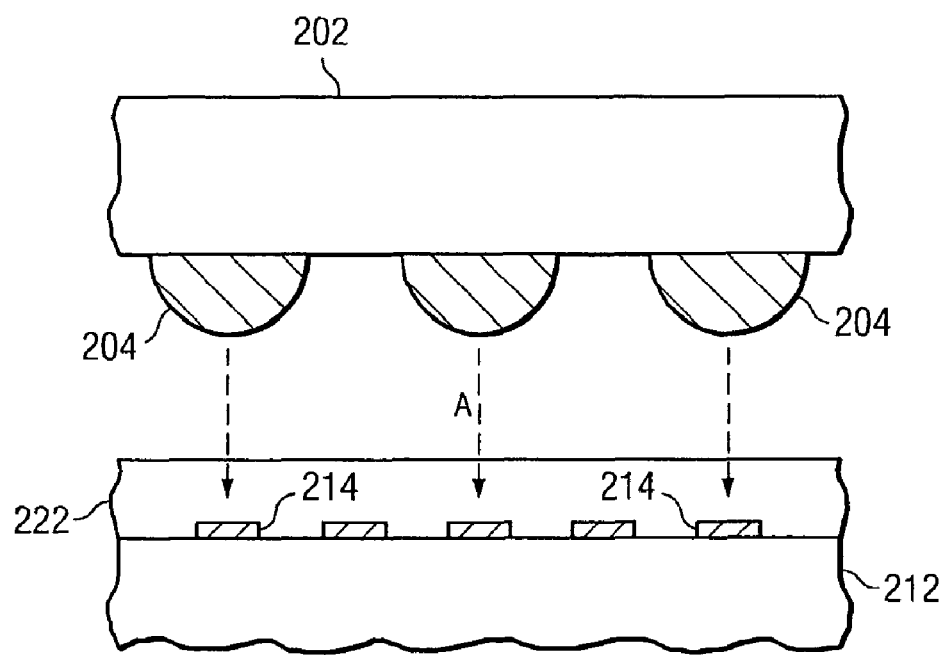
FIGS. 11A-11D are diagrammatic sketches in a sectional view illustrating steps in a process for making a flip chip interconnection according to the invention.
Figure 11B:
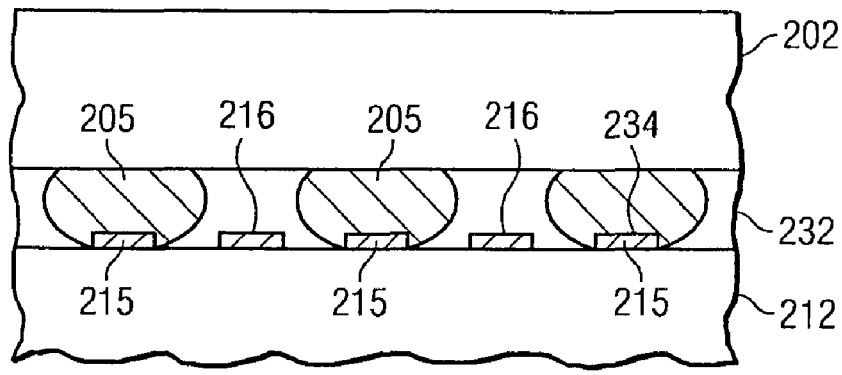
Figure 11C:
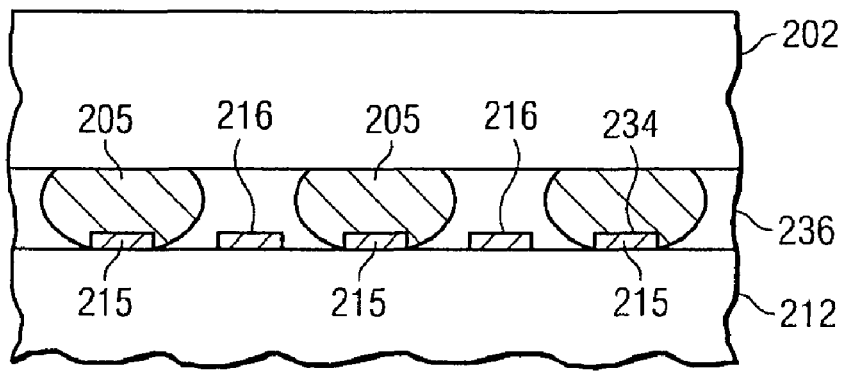
Figure 11D:
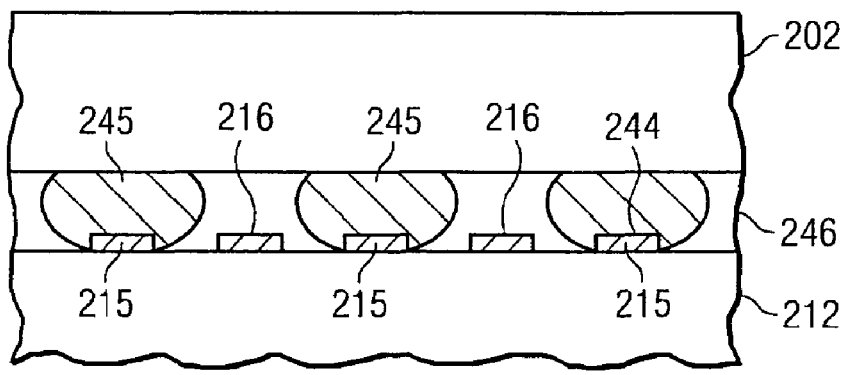

The process is shown in further detail in FIGS. 11A-11D. In FIG. 11A, a substrate 212 is provided on a die attach surface with conductive (metal) traces 214, and interconect sites on the traces are covered with an adhesive 222. The die 202 is positioned in relation to the substrate 212 such that the active side of the die faces the die attach side of the substrate, and is aligned (arrows A) such that bumps 204 on the die are aligned with corresponding mating surfaces on traces 214. The die and the substrate are moved toward one another so that the bumps contact the respective mating surfaces on the traces. Then as shown in FIG. 11B a force is applied to move the bumps 205 and traces 215 against one another, displacing the adhesive as shown at 232 in FIG. 11B, and deforming the bumps onto the mating surfaces 234 and over the edges of the traces. Deformation of the bumps on the traces breaks the oxide film on the contact surfaces of the bumps and the mating surfaces of the traces, establishing a good electrical connection, and deformation of the bumps over the edges of the traces helps establish a good temporary mechanical connection. As in the example of FIG. 10A-10C, the interconnect sites of certain of the traces 216 are out of the plane of FIG. 11B. Heat is applied to partially cure the adhesive as shown at 236 in FIG. 11C. Then heat is applied to raise the temperature of the bumps sufficiently to cause the fusible material of the bumps to melt, as shown in FIG. 11D. This substantially (though not necessarily fully) completes the cure of the adhesive 246 and completes the metallurgical interconnection of the bumps 245 onto the mating surfaces 244 at the interconnect sites on the leads 215. The cured adhesive stabilizes the die mount.

In an alternative embodiment of a preferred method, the adhesive can be pre-applied to the die surface, or at least to the bumps on the die surface, rather than to the substrate. The adhesive can, for example, be pooled in a reservoir, and the active side of the die can be dipped in the pool and removed, so that a quantity of the adhesive is carried on the bumps; then, using a pick-and-place tool, the die is positioned facing a supported substrate with the active side of the die toward the die attach surface of the substrate, and the die and substrate are aligned and moved one toward the other so that the bumps contact the corresponding traces (leads) on the substrate.

Such a method is described in U.S. Pat. No. 6,780,682, Aug. 24, 2004, which is hereby incorporated by reference. Then forcing, curing, and melting are carried out as described above.

Figure 12:
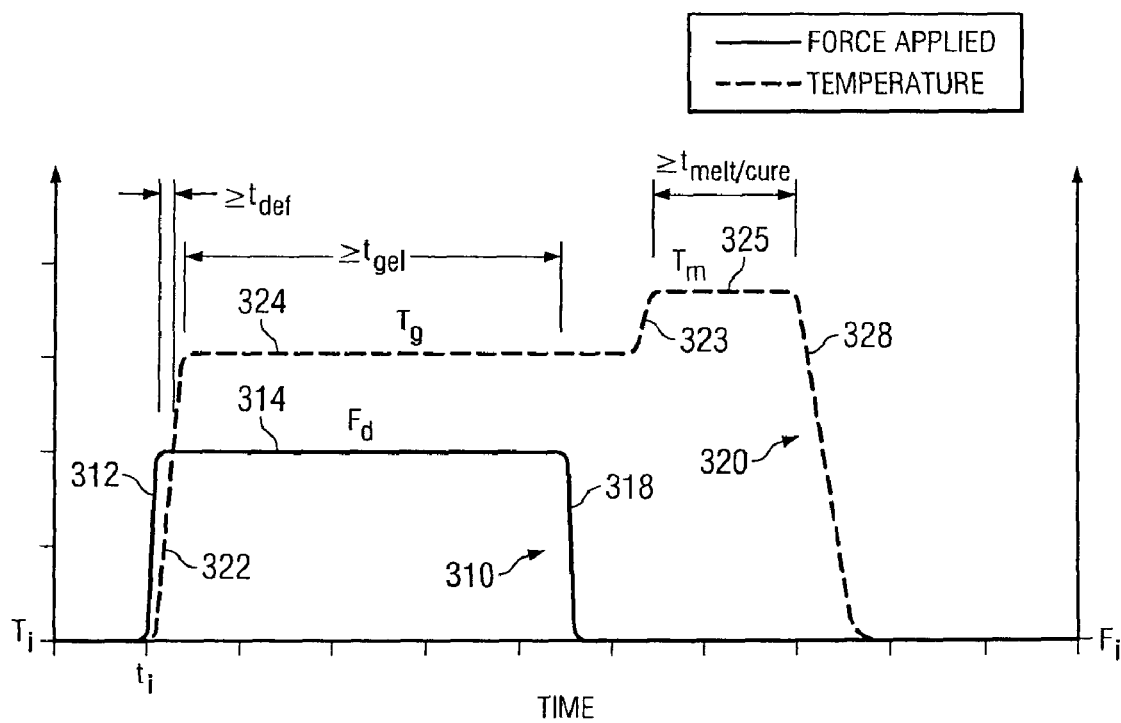
FIG. 12 is a diagrammatic sketch showing a force and temperature schedule for a process for making a flip chip interconnection according to the invention.

A force and temperature schedule for a process according to the invention is shown diagrammatically by way of example in FIG. 12. In this chart, time runs from left to right on the horizontal axis; a force profile 310 is shown as a thick solid line, and a temperature profile 320 is shown as a dotted line. The temperature profile begins at a temperature in the range about 80° C.-about 90° C. The force profile begins at essentially zero force. Beginning at an initial time $t_i$ the force is rapidly (nearly instantaneously) raised 312 from $F_i$ to a displacement/deformation force $F_d$ and held 314 at that force for a time, as discussed below. $F_d$ is a force sufficiently great to displace the adhesive away from between the bumps and the mating surfaces of the leads; and, preferably, sufficient to deform the fusible (lead-contacting) portion of the bumps onto the mating surface, breaking the oxide films and forming a good metal-to-metal (metallurgical) contact, and, in some embodiments, over the edges of the leads to establish a mechanical interlock of the bumps and the leads ("creep" deformation). The total amount of force required will depend upon the bump material and dimensions and upon the number of bumps, and can be determined without undue experimentation. As the force is raised, the temperature is also rapidly raised 322 from an initial temperature $T_i$ to a gel temperature Tg. The gel temperature Tg is a temperature sufficient to partially cure the adhesive (to a "gel"). Preferably, the force and temperature ramps are set so that there is a short lag time $t_{def}$ following the moment when $F_d$ is reached and before $T_g$ is reached, at least long enough to permit the elevated force to displace the adhesive and to deform the bumps before the partial cure of the adhesive commences. The assembly is held 314, 324 at the displacement/deformation pressure $F_d$ and at the gel temperature $T_g$ for a time $t_{gel}$ sufficient to effect the partial cure of the adhesive. The adhesive should become sufficiently firm that it can subsequently maintain a good bump profile during the solder remelt phase—that is, sufficiently firm to prevent undesirable displacement of the molten fusible material of the bump, or flow of the molten fusible material along the leads. Once the adhesive has partially cured to a sufficient extent, the pressure may be ramped down rapidly 318 to substantially no force (weight of the components). The temperature is then rapidly raised further 323 to a temperature $T_m$ sufficient to remelt the fusible portions (solder) of the bumps, and the assembly is held 325 at the remelt temperature $T_m$ for a time $t_{melt/cure}$ at least sufficient to fully form the solder remelt on the traces, and preferably sufficient to substantially (though not necessarily fully) cure the adhesive. Then the temperature is ramped down 328 to the initial temperature $T_i$, and eventually to ambient. The process outlined in FIG. 12 can run its course over a time period of 5-10 seconds.

The adhesive in embodiments as in FIG. 12 may be referred to as a "no-flow underfill". In some approaches to flip chip interconnection, the metallurgical interconnection is formed first, and then an underfill material is flowed into the space between the die and the substrate. The "no-flow underfill" according to the invention is applied before the die and the substrate are brought together, and the no-flow underfill is displaced by the approach of the bumps onto the leads, and by the opposed surfaces of the die and the substrate. The adhesive for the no-flow underfill adhesive according to the invention is preferably a fast-gelling adhesive—that is, a material that gels sufficiently at the gel temperature in a time period in the order of 1-2 seconds. Preferred materials for the no-flow underfill adhesive include, for example, so-called non-conductive pastes, such as those marketed by Toshiba Chemicals and by Loktite-Henkel, for example.

Alternative bump structures may be employed in the bump-on-lead interconnects according to the invention. Particularly, for example, so-called composite solder bumps may be used. Composite solder bumps have at least two bump portions, made of different bump materials, including one which is collapsible under reflow conditions, and one which is substantially non-collapsible under reflow conditions. The non-collapsible portion is attached to the interconnect site on the die; typical conventional materials for the non-collapsible portion include various solders having a high lead (Pb) content, for example. The collapsible portion is joined to the non-collapsible portion, and it is the collapsible portion that makes the connection with the lead according to the invention. Typical conventional materials for the collapsible portion of the composite bump include eutectic solders, for example.

Figure 13:
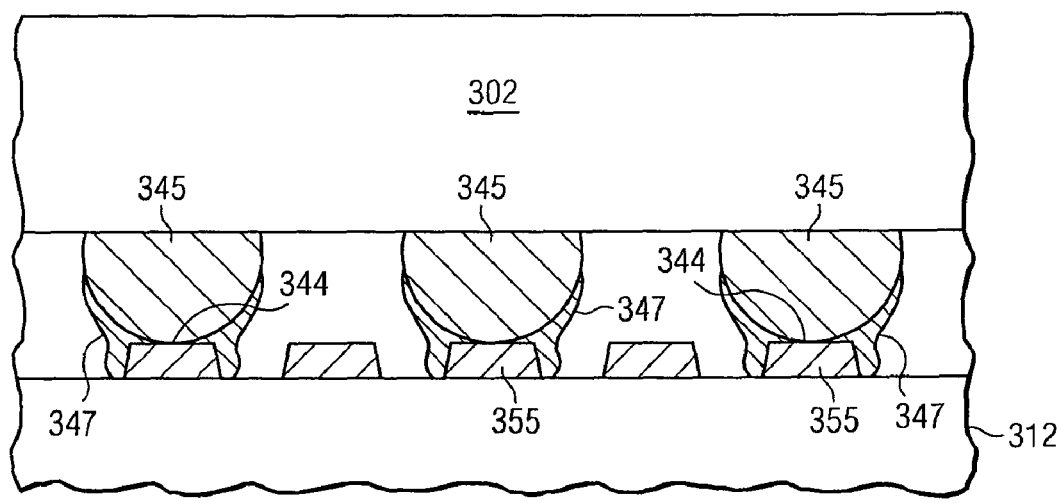
FIG. 13 is a diagrammatic sketch in a sectional view showing a bump-on-lead flip chip interconnection according to the invention, having composite bumps.

An example of a bump-on-lead interconnect employing a composite bump is shown in a diagrammatic sectional view in FIG. 13. Referring now to FIG. 13, die 302 is provided on die pads in the active side of the die with composite bumps 344 that include a noncollapsible portion 345 and a collapsible portion 347. The collapsible portion may be, for example, a eutectic solder or a relatively low temperature melt solder). The collapsible portion contacts the mating surface of the lead and, where deformation of the fusible portion of the bump over the lead 355 is desired, the collapsible portion of the bump is deformable under the conditions of force employed. The noncollapsible portion may be, for example, a solder having a high lead (Pb) content. The noncollapsible portion does not deform when the die is moved under pressure against the substrate 312 during processing, and does not melt during the reflow phase of the process. Accordingly the noncollapsible portion can be dimensioned to provide a standoff distance between the active surface of the die and the die attach surface of the substrate.

As may be appreciated, the bumps in embodiments as shown in, for example, FIGS. 4, 5, 6 and 7 need not necessarily be fully collapsible bumps. The structures shown in those FIGs. may alternatively be made using composite bumps, or using a solder-on-lead method, as described above.

Other embodiments are within the following claims.

What is claimed is:

1. A method of forming a semiconductor device, comprising:
    providing a semiconductor die;
    forming a plurality of bumps over the semiconductor die;
    providing a substrate; and
    forming a plurality of conductive traces on the substrate, each trace having an interconnect site for mating to the bumps, the interconnect sites having parallel edges along a length of the conductive traces under the bumps from a plan view for increasing escape routing density, wherein the interconnect sites have a width which is less than 1.2 times a width of the conductive trace.

2. The method of claim 1, wherein one of the bumps has a noncollapsible portion for attaching to a contact pad on the semiconductor die and fusible portion for attaching to the interconnect site.

3. The method of claim 2, wherein the noncollapsible portion includes lead solder.

4. The method of claim 2, wherein the fusible portion melts at a temperature which avoids damage to the substrate during reflow.

5. The method of claim 2, wherein the fusible portion includes eutectic solder.

6. The method of claim 1, further including disposing an underfill material between the semiconductor die and substrate.

7. The method of claim 1, wherein the interconnect sites have a width which is less than one-half a diameter of the bump.

8. A method of making a semiconductor device, comprising;
    providing a semiconductor die;
    forming a bump over the semiconductor die; and
    providing a substrate having a conductive trace formed on a die attach surface of the substrate for mating to the bump, the conductive trace having an interconnect site with parallel edges along a length of the conductive trace under the bump from a plan view such that a width of the interconnect site under the bump is no greater than a width of the conductive trace away from the bump.

9. The method of claim 8, wherein each interconnect bump has a noncollapsible portion including lead solder for attaching to a contact pad on the semiconductor die and fusible portion including eutectic solder for attaching to the interconnect site.

10. The method of claim 9, wherein the fusible portion melts at a temperature which avoids damage to the substrate during reflow.

11. The method of claim 8, further including disposing an underfill material between the semiconductor die and substrate.

12. The method of claim 8, wherein the interconnect sites have a width which is less than one-half a diameter of the bump.

13. A method of making a semiconductor device, comprising;
    providing a semiconductor die;
    forming a bump over the semiconductor die; and
    providing a substrate having a conductive trace formed on a die attach surface of the substrate, the conductive trace having an interconnect site for mating with the bump, the interconnect sites having a width substantially equal to a width of the trace away from the interconnect site.

14. The method of claim 13, wherein the bump has a noncollapsible portion for attaching to a contact pad on the semiconductor die and fusible portion for attaching to the interconnect site.

15. The method of claim 14, wherein the fusible portion melts at a temperature which avoids damage to the substrate during reflow.

16. The method of claim 14, wherein the noncollapsible portion includes lead solder.

17. The method of claim 14, wherein the fusible portion includes eutectic solder.

18. The method of claim 13, wherein the interconnect sites have a width which is less than one-half a diameter of the bump.

19. A semiconductor device, comprising:
    a semiconductor die;
    a plurality of bumps formed over the semiconductor die;
    a substrate; and
    a plurality of conductive traces formed on the substrate, each trace having an interconnect site for mating to the bumps, the interconnect sites having parallel edges along a length of the conductive traces under the bumps from a plan view for increasing escape routing density, wherein the interconnect sites have a width which is less than 1.2 times a width of the conductive trace.

20. The semiconductor device of claim 19, wherein one of the bumps has a noncollapsible portion for attaching to a contact pad on the semiconductor die and fusible portion for attaching to the interconnect site.

21. The semiconductor device of claim 20, wherein the noncollapsible portion includes lead solder.

22. The semiconductor device of claim 20, wherein the fusible portion includes eutectic solder.

23. The semiconductor device of claim 19, wherein the interconnect sites have a width which is less than one-half a diameter of the bump.

* * * * *